(12) United States Patent
Zhou

(10) Patent No.: US 12,426,202 B2
(45) Date of Patent: Sep. 23, 2025

(54) SYSTEM FOR ENSURING CONTINUED OPERATION OF FAN NOTWITHSTANDING BMC FAILURE

(71) Applicant: Fulian Precision Electronics (Tianjin) Co., LTD., Tianjin (CN)

(72) Inventor: Xiao-Long Zhou, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 78 days.

(21) Appl. No.: 18/419,782

(22) Filed: Jan. 23, 2024

(65) Prior Publication Data

US 2024/0196560 A1 Jun. 13, 2024

Related U.S. Application Data

(62) Division of application No. 17/886,799, filed on Aug. 12, 2022.

(30) Foreign Application Priority Data

Apr. 29, 2022 (CN) .......................... 202210474951.7

(51) Int. Cl.
| H05K 7/20 | (2006.01) |
| F04D 27/00 | (2006.01) |
| G06F 11/00 | (2006.01) |
| G06F 11/30 | (2006.01) |

(52) U.S. Cl.
CPC ....... *H05K 7/20209* (2013.01); *F04D 27/004* (2013.01); *G06F 11/00* (2013.01); *G06F 11/30* (2013.01); *H05K 7/20718* (2013.01); *H05K 7/20836* (2013.01)

(58) Field of Classification Search
CPC .......... H05K 7/20209; H05K 7/20718; H05K 7/20836; F04D 27/004; F04D 27/001; F04D 29/582; F04D 27/00; F04D 25/08; F04D 27/008; G06F 11/00; G06F 11/30; G06F 1/20; Y02D 10/00
See application file for complete search history.

(56) References Cited

FOREIGN PATENT DOCUMENTS

| CN | 109882440 A | 6/2019 | |
| CN | 110399024 A | 11/2019 | |
| CN | 113849056 A | * 12/2021 | ............. F04D 25/08 |
| CN | 114281172 A | * 4/2022 | |

* cited by examiner

*Primary Examiner* — Charles Cai
(74) *Attorney, Agent, or Firm* — ScienBiziP, P.C.

(57) ABSTRACT

A system for maintaining the operation of a cooling fan for a server if that function of a baseboard management controller (BMC) of the server should fail includes the BMC and a control module. The control module is electrically connected to the BMC and the fan, and the control module receives a first signal outputted by the BMC in a cycle and determines the state of the BMC depending on whether the first signal includes a change in level or fails to include a change in level. When an abnormal state of the BMC is determined, the control module outputs a preset pulse width modulation (PWM) signal to the fan to maintain operation of the fan.

8 Claims, 4 Drawing Sheets

SYSTEM FOR ENSURING CONTINUED OPERATION OF FAN NOTWITHSTANDING BMC FAILURE

FIELD

The present disclosure relates to the technical field of server, in particular to a system for controlling fan.

BACKGROUND

In order to ensure the stability of the server, the server ensures that its own fan is operating. At present, the baseboard management controller (BMC) of the server applies a control method for the baseboard management controller (BMC) to output pulse width modulation (PWM) signals to the fan to adjust the speed of the fan. However, when BMC is working abnormally, the fan may work abnormally, or even stop, leading to overheating of the server and shut down.

Therefore, improvement is desired.

DETAILED DESCRIPTION

The technical solutions in the embodiments of the present disclosure will be described in conjunction with the accompanying drawings in the embodiments of the present disclosure. Obviously, the described embodiments are part of the embodiments of the present disclosure, not all of them. Based on the embodiments of the present disclosure, all other embodiments obtained by those of ordinary skill in the art without creative work shall fall within the protection scope of the present disclosure. The terms used in the description of the present disclosure herein are only for the purpose of describing specific embodiments and are not intended to limit the present disclosure.

In the embodiment of the present disclosure, "first", "second" and other terms are only used for the purpose of distinguishing between descriptions and cannot be understood as indicating or implying relative importance, or as indicating or implying order. The features defined as "first" and "second" may include one or more of the features explicitly or implicitly. In the description of the embodiments of the present disclosure, the terms "exemplary" or "for example" are used as examples or explanations. Any embodiment or design described as "exemplary" or "for example" in the embodiments of the present disclosure shall not be interpreted as being more preferred or advantageous than other embodiments or designs.

In the article, unless otherwise expressly specified and limited, for location words, the terms "above", "below", "upper end", "lower end", "lower surface", "clockwise", "counterclockwise", "left", "right" and so on indicate that the location and position relationship are based on the location or position relationship shown in the attached drawings, and are only for the convenience of describing this article and simplifying the description, rather than indicating or implying that the device or element referred to must have a specific orientation, be constructed, or be operated in a specific orientation, it cannot be understood as limiting the specific scope of protection of the present disclosure.

In the article, unless otherwise expressly specified and limited, the terms "first" and "second" are only used for descriptive purposes and cannot be understood as indicating or implying relative importance or implicitly indicating the number of technical features. Thus, "first" and "second" defining features can explicitly or implicitly include one or more of the features.

Some embodiments of the present disclosure are described in detail below in combination with the accompanying drawings. Without conflict, the following embodiments and features in the embodiments can be combined with each other.

Embodiment 1

Figure 1:
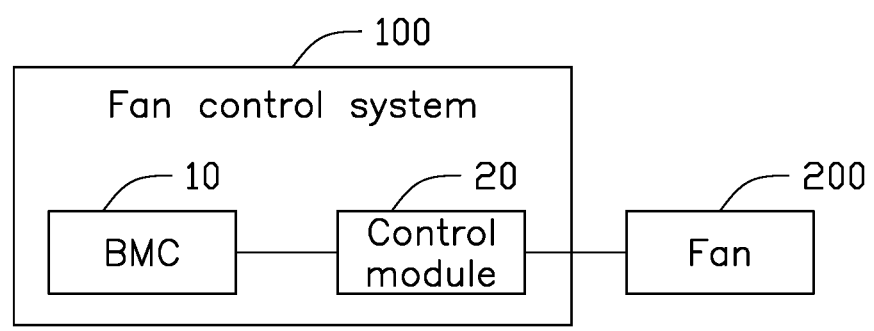
FIG. 1 is a schematic diagram of a fan control system according to an embodiment of the present disclosure.

FIG. 1 illustrates a fan control system 100 in accordance with an embodiment of the present disclosure.

The fan control system 100 is used to control the operation of a fan 200. The fan control system 100 can be installed in the server (not shown in the figure) to reduce the risk of fan malfunction leading to server overheating and shutdown. The fan control system 100 includes a baseboard management controller (BMC) 10 and a control module 20 that are electrically connected to each other. In some embodiments, the control module 20 may be a controller.

The control module 20 is electrically connected between the BMC 10 and the fan 200. The control module 20 is used to receive the first signal output by the BMC and determine whether the BMC 10 is in an abnormal state according to the received first signal.

When the control module 20 detects that the BMC 10 is in an abnormal state, the control module 20 outputs a preset pulse width modulation (PWM) signal to the fan 200 to keep the fan 200 running. When the control module 20 detects that the BMC 10 is in a normal state, the control module 20 controls the fan 200 to operate according to the received first signal.

When the control module 20 detects that the first signal, for a preset number of continuous cycles, is in an error state, the control module 20 determines that the BMC 10 is in an abnormal state. On the contrary, when the control module 20 detects that the first signal is not in an error state continuously within a preset number of cycles, the control module 20 determines that the BMC 10 is in a normal state.

Figure 2:
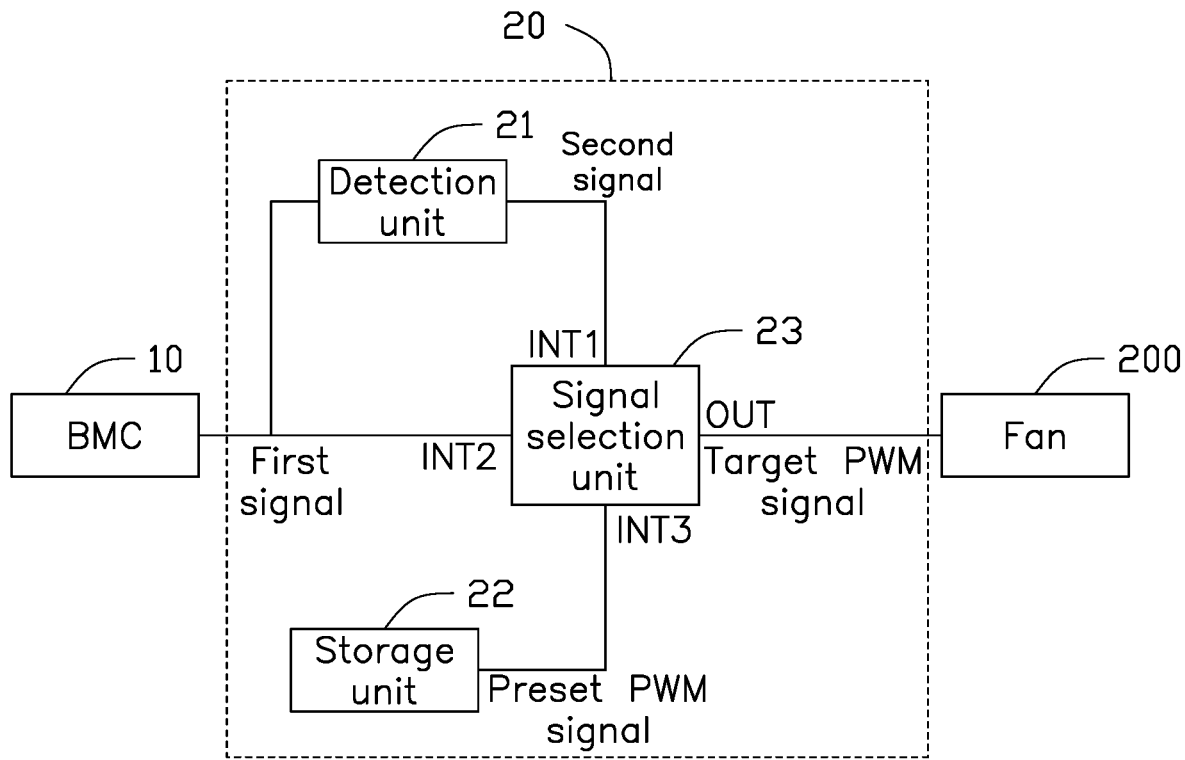
FIG. 2 is a schematic diagram of the fan control system according to another embodiment of the present disclosure.

Referring to FIG. 2, in one embodiment, the control module 20 includes a detection unit 21, a storage unit 22, and a signal selection unit 23.

The detection unit 21 is electrically connected between the BMC 10 and the signal selection unit 23 to detect whether the first signal is in an error state continuously within a preset number of cycles, so as to output the corresponding second signal to the signal selection unit 23.

The first signal output by the BMC 10 can be a dynamic PWM signal.

The dynamic PWM signal refers to the PWM signal that the BMC 10 adjusts in real time according to the temperature of the server. The error state means that the level state of the first signal remains unchanged.

When the level state of the first signal remains unchanged for a preset number of cycles, the control module 20 determines that the BMC 10 is in an abnormal state. When the control module 20 detects that the first signal is not in an error state continuously within a preset number of cycles, that is, the level state of the first signal has changed at least once in a preset number of consecutive cycles, the control module 20 determines that the BMC 10 is in a normal state.

The level state of the first signal can remain unchanged, that is, either the level state of the first signal remains at high-level or the level state of the first signal remains at low-level.

A change in the level state of the first signal may be the first signal falling from the high-level state to the low-level state, or the first signal rising from the low-level state to the high-level state.

In the embodiment of the present disclosure, each cycle is a continuous period of time, such as one second.

When the fan 200 is running at full speed, that is, when the fan 200 is running at the highest speed, the duty cycle of the first signal is slightly less than 100%, such as 99%. That is, even if the fan 200 operates at full speed, the first signal used to control the fan 200 to operate at full speed can change from high to low level at least once in the preset cycle. The detection unit 21 can determine whether the BMC 10 is in an abnormal state by detecting the absence of a change in the level state within a preset number of cycles in the generated first signal.

When the detection unit 21 detects that the first signal has not changed the level state within a preset number of cycles (such as 5 cycles), that is, the BMC 10 is in an abnormal state, the second signal output by the detection unit 21 is in the first level state, such as a low-level state. When the detection unit 21 detects that the first signal has changed the level state within a preset number of cycles (such as 5 cycles), that is, the BMC 10 is in a normal state, the second signal output by the detection unit 21 is in the second level state, such as a high-level state.

In the embodiment of the present disclosure, the storage unit 22 is electrically connected to the signal selection unit 23, the storage unit 22 is used to output a preset PWM signal to the signal selection unit 23. In the embodiment of the present disclosure, the preset PWM signal is also a pulse width modulated signal.

In some embodiments, the storage unit 22 may be a register.

In the embodiment of the present disclosure, the signal selection unit 23 is also directly electrically connected to the BMC 10, to receive the first signal. The signal selection unit 23 outputs a target PWM signal directed to the fan 200 according to the level state of the second signal input by the detection unit 21 and controls the fan 200 to operate at the speed of the target PWM. The target PWM signal is either the first signal or the preset PWM signal according to the level state of the second signal.

The signal selection unit 23 selects the first signal or the preset PWM signal to output to the fan 200 according to the level state of the second signal input by the detection unit 21 to control the operation of the fan 200.

For example, the signal selection unit 23 includes a first input terminal INT1, a second input terminal INT2, a third input terminal INT3, and an output terminal OUT.

The first input terminal INT1 is electrically connected to the output terminal of the detection unit 21 for receiving the second signal. The second input terminal INT2 is electrically connected to the BMC 10 for receiving the first signal. The third input terminal INT3 is electrically connected to the output terminal of the storage unit 22 to receive a preset PWM signal. The output terminal OUT of the signal selection unit 23 is electrically connected to the fan 200 for outputting a target PWM signal to the fan 200.

When the preset number of cycles is k cycles (for example, k is equal to 5), and when during the k-th cycle and any cycle after that, the level state of the second signal received by the first input terminal INT1 of the signal selection unit 23 is low. That is, when the BMC 10 is currently in an abnormal state, the target PWM signal output by the signal selection unit 23 is a preset PWM signal. Thereby, the fan 200 operates at a preset speed upon receiving the target PWM signal.

When the preset number of cycles is k cycles (for example, k is equal to 5), and when during the k-th cycle and any cycle after that, the level state of the second signal received by the first input terminal INT1 of the signal selection unit 23 is high, the target PWM signal output by the signal selection unit 23 is the first signal. Thereby, the fan 200 operates at a corresponding speed after receiving the target PWM signal.

Until the operation cycle of the fan control system 100 has reached the preset number of cycles, that is, the level state of the second signal output by the detection unit 21 is high in the previous k−1 cycle of the fan control system 100, the target PWM signal output by the signal selection unit 23 is the first signal at this time.

In some embodiments, until the operation cycle of the fan control system 100 has reached the preset number of cycles, that is, during the previous k−1 cycles of the BMC 10, the duty cycle of the output first signal in each cycle is 99%. The fan control system 100 controls the fan 200 to run at full speed in the previous k−1 cycle.

The duty cycle refers to the proportion of the effective signal time to the total time in a cycle. For example, the effective pulse width of the first signal may be 1 μs. The preset period can be 4 μs, and then in the current cycle, the duty cycle of the first signal is 0.25, that is, at this time, the value of the duty cycle of the first signal is 0.25.

In the embodiment, the signal selection unit 23 is a multiplexer (MUX).

The duty cycle of the preset PWM signal output by the storage unit 22 can be set by those skilled in the art according to needs. The present disclosure does not limit the duty cycle of the preset PWM signal.

In the embodiment, when the preset number of cycles is k cycles (for example, k is equal to 5), the detection unit 21 determines whether the BMC 10 is in an abnormal state by determining whether there is a change in the level state of the first signal of the current cycle and the previous k−1 cycles. When the detection unit 21 detects that the level state of the first signal of the current cycle and the previous k−1 cycles remains unchanged, the detection unit 21 determines that the BMC 10 is in an abnormal state and outputs the second signal in a low-level state. When the detection unit 21 detects at least one change in the level state of the first signal in the current cycle and the previous k−1 cycles, the detection unit 21 determines that the BMC 10 is in a normal state and outputs the second signal in a high-level state.

The control module 20 may be a complex programmable logic device (CPLD). It can be understood that in other embodiments, the control module 20 can also be an application specific integrated circuit (ASIC), a field programmable gate array (FPGA) or other programmable logic devices, discrete gate or transistor logic devices, discrete hardware components.

In some embodiments, the fan control system 100 further includes a warning unit (not shown), such as LED lights, buzzers, voice modules, and other graphic warning modules. The warning unit is electrically connected to the control module 20. When the detection unit 21 detects that the BMC 10 is in an abnormal state, the control module 20 controls the warning unit to output information to technicians to make repairs.

The fan control system 100 of the embodiment of the present disclosure detects whether the first signal output by the BMC 10 remains unchanged for a preset number of cycles, through the detection unit 21, to determine whether the BMC is in an abnormal state. When the detection unit 21 detects that the BMC 10 is in an abnormal state, the control module 20 outputs a preset PWM signal to control and continue the normal operation of the fan 200, so as to ensure the heat dissipation from the server and reduce the risk of the server shutting down due to overheating.

Embodiment 2

Figure 3:
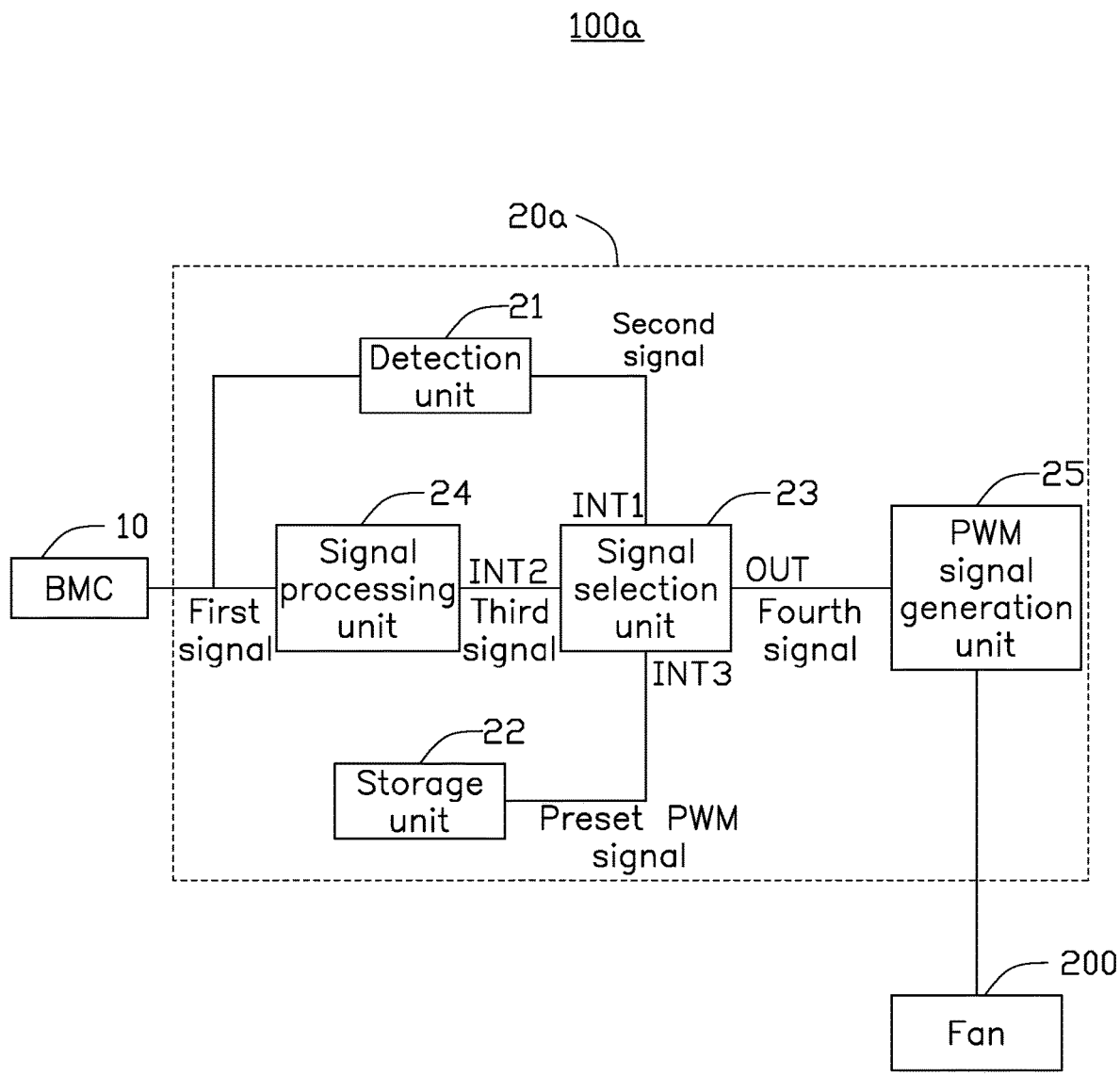
FIG. 3 is a schematic diagram of the fan control system according to another embodiment of the present disclosure.

FIG. 3 illustrates a fan control system 100a in accordance with an embodiment of the present disclosure.

The fan control system 100a includes a BMC 10 and a control module 20a.

The difference between the fan control system 100a and the fan control system 100 is that the control module 20a also includes a signal processing unit 24 and a PWM signal generation unit 25. The level state of the first signal not changing remains the error state.

In the embodiment, the first signal output by the BMC 10 is a dynamic PWM signal.

In the embodiment, the signal processing unit 24 is electrically connected between the BMC 10 and the signal selection unit 23 to process the received first signal to obtain the duty cycle of the first signal in each preset cycle and generate the corresponding third signal. The value of the third signal is the duty cycle value of the PWM signal contained in the first signal.

The storage unit 22 is electrically connected to the signal selection unit 23 for outputting a preset adjustment signal to the signal selection unit 23. In the embodiment of the present disclosure, the value of the preset adjustment signal is also the preset duty cycle value.

The signal selection unit 23 is used to select and output the third signal or the preset adjustment signal to the PWM signal generation unit 25 according to the state of the second signal input by the detection unit 21, so as to control the PWM signal generation unit 25 to generate the pulse width modulated signal. In other words, the fourth signal output by the signal selection unit 23 is either the third signal or it is the preset adjustment signal.

The first input terminal INT1 of the signal selection unit 23 is electrically connected to the output terminal of the detection unit 21 for receiving the second signal. The second input terminal INT2 is electrically connected to the output terminal of the signal processing unit 24 for receiving the third signal. The third input terminal INT3 is electrically connected to the output terminal of the storage unit 22 to receive a preset adjustment signal. The output terminal OUT of the signal selection unit 23 is electrically connected to the PWM signal generation unit 25 to output a fourth signal to the PWM signal generation unit 25.

The PWM signal generation unit 25 is used to receive the fourth signal output by the signal selection unit 23 to generate the corresponding PWM signal, so as to control the fan 200 to operate at a speed to dissipate heat from the server. When the fourth signal received by the PWM signal generation unit 25 is a third signal, the PWM signal generation unit 25 generates a target pulse width modulated signal according to the third signal and outputs it to the fan 200. When the fourth signal received by the PWM signal generation unit 25 is a preset adjustment signal, the PWM signal generation unit 25 generates a preset pulse width modulation signal according to the preset adjustment signal and outputs it to the fan 200.

In the present disclosure, the preset adjustment signal stored by the storage unit 22 can be data containing the duty cycle value, and the duty cycle of the first signal can be extracted by the signal processing unit 24. Therefore, the number of PWM signals required by the fan control system 100 can be reduced, and complexity of the circuitry for the fan control system 100 can be reduced.

Referring to FIG. 3, in another embodiment, the first signal output by the BMC 10 can also be an inter integrated circuit (I2C) signal, and the first signal contains the duty cycle value. In this embodiment, the error state is the loss of the first signal, that is, the BMC 10 does not output the first signal.

I2C bus is the existing signal transmission line between the BMC 10 and control module 20.

The BMC 10 does not need to output additional PWM signal, the duty cycle value of PWM signal is merely stored in the register, and I2C bus is electrically connected to the register, so that the BMC 10 can output the first signal to the signal processing unit 24. In the embodiment, the BMC 10 does not need to set an additional PWM signal generation module, which can simplify the circuit structure.

In some embodiments, the BMC 10 is provided with a specific register (not shown in the figures) to output the first signal at a fixed time.

For example, in the fan control system 100a, the BMC 10 outputs the first signal in a period of one second. It is understandable that when the BMC 10 does not output the first signal continuously within a preset number of cycles, it can be considered that the BMC 10 is in an abnormal state.

The detection unit 21 is electrically connected between the BMC 10 and the signal selection unit 23 to detect whether the BMC 10 outputs a first signal within a preset number of consecutive cycles, to output a second signal to the signal selection unit 23.

When the detection unit 21 detects that the BMC 10 has not output the first signal continuously for a preset number of cycles, such as k cycles, that is, when the BMC 10 is in an abnormal state, and the detection unit 21 outputs the second signal in the first level state to the signal selection unit 23. When the detection unit 21 detects that the first signal has not been output by the BMC 10 for at most k−1 consecutive cycles, that is, when the BMC 10 is in the normal state, and the detection unit 21 outputs the second signal in the second level state to the signal selection unit 23.

In the embodiment, the BMC 10 is connected to the control module 20 through the I2C bus. The signal processing unit 24 is used to decode the received first signal based on the I2C protocol to output a corresponding third signal. It can be understood that in the embodiment of the present disclosure, the third signal is also a signal containing the duty cycle value.

In the embodiment, the signal processing unit 24 is also provided with a specific register (not shown in the figures) for storing the value of the third signal obtained from the previous cycle of processing. When the BMC 10 does not output the first signal within k−1 cycles, the signal processing unit 24 outputs the third signal processed in the previous cycle to the second input terminal INT2 of the signal selection unit 23, so that the signal selection unit outputs the fourth signal and controls the fan 200 to continue working normally.

Figure 4:
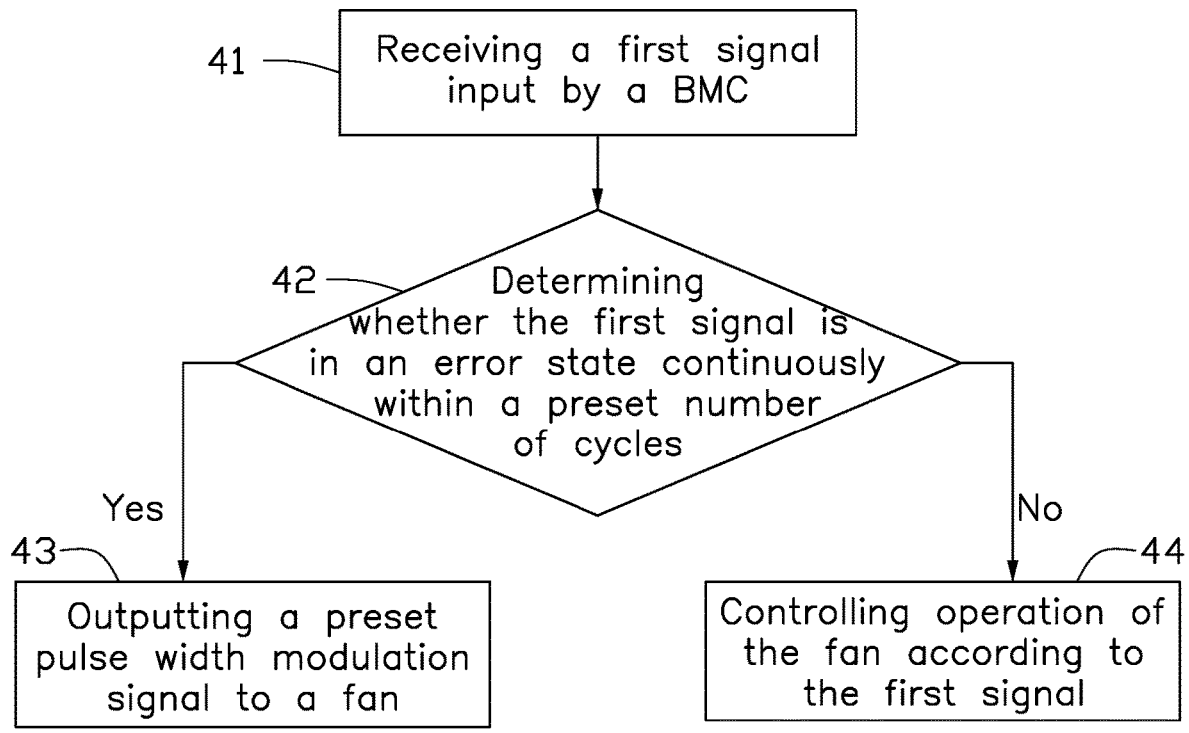
FIG. 4 is a flowchart of a fan control method according to an embodiment of the present disclosure.

FIG. 4 is a flowchart depicting an embodiment of a fan control method. The fan control method can be applied to the fan control system 100 as described above. The fan control method can be performed by the control module 20 or the control module 20a.

Each block shown in FIG. 4 represents one or more processes, methods, or subroutines, carried out in the example method. Furthermore, the illustrated order of blocks is illustrative only and the order of the blocks can change. Additional blocks can be added or fewer blocks may be utilized, without departing from the present disclosure. The example method can begin at block 41.

At block 41, receiving a first signal input by a BMC

At block 42, determining whether the first signal is in an error state continuously within a preset number of cycles. If the first signal is in an error state continuously within a preset number of cycles, block 43 is implement, otherwise block 44 is implement.

The error state is the error state mentioned in the above embodiments 1 to 2, which will not be repeated here.

In block 42, when it is detected that the first signal is in an error state continuously for a preset number of cycles, it is determined that the BMC 10 is in an abnormal state.

At block 43, outputting a preset pulse width modulation signal to a fan. In block 42, When it is detected that the first signal is not in the error state continuously within the preset number of cycles, it is determined that the BMC 10 is in a normal state.

At block 44, controlling operation of the fan according to the first signal.

Each functional module in each embodiment of the present disclosure can be integrated in the same processing module, each module can exist separately, or two or more modules can be integrated in the same module. The above integrated modules can be realized in the form of hardware or hardware plus software function modules.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. A fan control system configured for controlling a fan to operate and comprising:
  a baseboard management controller (BMC);
  a control module electrically connected to the BMC and the fan, and configured to receive a first signal outputted by the BMC and determine whether the BMC is in an abnormal state according to the first signal;
  wherein when the BMC is in an abnormal state, the control module outputs a preset pulse width modulation (PWM) signal to the fan to keep continuous operation of the fan;
  wherein when the first signal is in an error state continuously within a preset number of cycles, the control module determines the BMC is in the abnormal state; and
  wherein the control module further comprises a detection circuit, a register, a multiplexer. a signal processing circuit and a PWM signal generation circuit, the detection unit is electrically connected between the BMC and the multiplexer to detect whether a level state of the first signal is continuously in the error state within the preset number of cycles, to output a second signal to the multiplexer; the signal processing circuit is electrically connected between the BMC and the multiplexer, the signal processing circuit is configured to process the first signal to obtain a duty cycle value of the first signal in each preset cycle and generate a third signal containing the duty cycle value, and output the third signal to the multiplexer: the register is electrically connected to the multiplexer, the register is configured to output a preset adjustment signal containing a preset duty cycle value to the multiplexer; the multiplexer is also electrically connected to the PWM signal generation circuit, and the multiplexer selects to output the third signal or the preset adjustment signal to the PWM signal generation circuit according to the second signal; the PWM signal generation circuit is electrically connected to the fan, the PWM signal generation circuit is configured to generate a target PWM signal according to the third signal and outputting the target PWM signal to the fan, or the PWM signal generation circuit is configured to generate the preset PWM signal according to the preset adjustment signal and output the preset PWM signal to the fan.

2. The fan control system of claim 1, wherein when the detection circuit detects the BMC is in the abnormal state according to the first signal, the detection circuit outputs the second signal, and the second signal is in a first level state, the multiplexer outputs the preset adjustment signal to the PWM signal generation circuit according to the second signal; and when the detection circuit detects the BMC is in the normal state according to the first signal, the detection circuit outputs the second signal, and the second signal is in a second level state, the multiplexer outputs the third signal to the PWM signal generation circuit according to the second signal.

3. The fan control system of claim 2, wherein the error state is that level state of the first signal remains unchanged, and the first signal is a PWM signal.

4. The fan control system of claim 2, wherein the BMC is electrically connected to the signal processing circuit through an integrated circuit bus, and the first signal comprises a duty cycle value, and the error state is loss of the first signal.

5. A fan control system configured for controlling a fan to operate and comprising:
  a baseboard management controller (BMC);
  a control module electrically connected to the BMC and the fan, and configured to receive a first signal outputted by the BMC and determine whether the BMC is in an abnormal state according to the first signal; wherein the error state is that level state of the first signal remains unchanged;
  wherein when the BMC is in an abnormal state, the control module outputs a preset pulse width modulation (PWM) signal to the fan to keep continuous operation of the fan;
  wherein when the first signal is in an error state continuously within a preset number of cycles, the control module determines the BMC is in the abnormal state; and
  wherein the control module further comprises a detection circuit, a register, a multiplexer, a signal processing circuit and a PWM signal generation circuit, the detection unit is electrically connected between the BMC and the multiplexer to detect whether a level state of the first signal is continuously in the error state within the preset number of cycles, to output a second signal to the multiplexer; the signal processing circuit is electrically connected between the BMC and the multiplexer, the signal processing circuit is configured to process the first signal to obtain a duty cycle value of the first signal in each preset cycle and generate a third signal containing the duty cycle value, and output the third signal to the multiplexer; the register is electrically connected to the multiplexer, the register is configured to output a preset adjustment signal containing a preset duty cycle value to the multiplexer; the multiplexer is also electrically connected to the PWM signal generation circuit, and the multiplexer selects to output the third signal or the preset adjustment signal to the PWM signal generation circuit according to the second signal; the PWM signal generation circuit is electrically connected to the fan, the PWM signal generation circuit is configured to generate a target PWM signal according to the third signal and outputting the target PWM signal to the fan, or the PWM signal generation circuit is configured to generate the preset PWM signal according to the preset adjustment signal and output the preset PWM signal to the fan.

6. The fan control system of claim 5, wherein when the detection circuit detects the BMC is in the abnormal state according to the first signal, the detection circuit outputs the second signal, and the second signal is in a first level state, the multiplexer outputs the preset adjustment signal to the PWM signal generation circuit according to the second signal; and when the detection circuit detects the BMC is in the normal state according to the first signal, the detection circuit outputs the second signal, and the second signal is in a second level state, the signal selection unit multiplexer outputs the third signal to the PWM signal generation circuit according to the second signal.

7. The fan control system of claim 6, wherein the first signal is a PWM signal.

8. The fan control system of claim 6, wherein the BMC is electrically connected to the signal processing circuit through an integrated circuit bus, and the first signal comprises a duty cycle value, and the error state is loss of the first signal.

\* \* \* \* \*